United States Patent
Goh et al.

(10) Patent No.: US 11,683,931 B2
(45) Date of Patent: Jun. 20, 2023

(54) SEMICONDUCTOR MEMORY DEVICE AND METHOD OF MANUFACTURING THE SAME

(71) Applicant: SK hynix Inc., Icheon-si (KR)

(72) Inventors: Han Na Goh, Icheon-si (KR); Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 327 days.

(21) Appl. No.: 16/820,370

(22) Filed: Mar. 16, 2020

(65) Prior Publication Data

US 2021/0066331 A1    Mar. 4, 2021

(30) Foreign Application Priority Data

Aug. 26, 2019    (KR) .......................... 10-2019-0104730

(51) Int. Cl.
| | |
|---|---|
| *H01L 27/11556* | (2017.01) |
| *H10B 41/27* | (2023.01) |
| *H01L 21/768* | (2006.01) |
| *G11C 5/06* | (2006.01) |
| *G11C 5/02* | (2006.01) |
| *H10B 43/27* | (2023.01) |

(52) U.S. Cl.
CPC ............. *H10B 41/27* (2023.02); *G11C 5/025* (2013.01); *G11C 5/06* (2013.01); *H01L 21/76841* (2013.01); *H10B 43/27* (2023.02)

(58) Field of Classification Search
CPC ......... H01L 27/11556; H01L 21/76841; H01L 27/11582; H01L 21/76831; H01L 27/11548; H01L 27/11575; H01L 21/76816; H01L 27/11573; H01L 29/792; H01L 21/3088; H01L 21/3085; H01L 21/3086; H01L 21/823807; H01L 21/823821; H01L 27/0924; H01L 29/1037; H01L 29/161; H01L 29/20; H01L 29/7853; H01L 21/823431; H01L 29/66795; H01L 29/785; G11C 5/025; G11C 5/06; H10B 41/27; H10B 43/27; H10B 41/50; H10B 43/50; H10B 43/40
See application file for complete search history.

(56) References Cited

U.S. PATENT DOCUMENTS

| | | | |
|---|---|---|---|
| 2016/0268268 A1* | 9/2016 | Kobayashi | .......... H01L 29/1037 |
| 2020/0294913 A1* | 9/2020 | Ito | ..................... H01L 21/76877 |
| 2022/0068967 A1* | 3/2022 | Yamazaki | ............. H01L 29/788 |

FOREIGN PATENT DOCUMENTS

| | | |
|---|---|---|
| KR | 1020160070896 A | 6/2016 |
| KR | 1020170139390 A | 12/2017 |

* cited by examiner

*Primary Examiner* — Cuong B Nguyen
(74) *Attorney, Agent, or Firm* — William Park & Associates Ltd.

(57) ABSTRACT

The semiconductor memory device includes a stack structure including first material films stacked, but spaced apart from each other, in a slimming region, the first material films being stacked in a step structure in the slimming region, a contact hole exposing a portion of the first material films formed in different layers in the slimming region, and a plurality of material films that are applied and etched to electrically connect one of the material layers to a peripheral circuit.

11 Claims, 11 Drawing Sheets

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2019-0104730, filed on Aug. 26, 2019, in the Korean Intellectual Property Office, the entire disclosure of which is incorporated herein by reference.

BACKGROUND

Field of Invention

The present disclosure relates to a semiconductor memory device and a method of manufacturing the same, and more particularly, to a semiconductor memory device including memory cells, stacked in a direction perpendicular to a substrate, and a method of manufacturing the same.

Description of Related Art

A semiconductor memory device may include a volatile memory device (in which stored data is lost when power supply is interrupted) and a non-volatile memory device (in which stored data is maintained even though power supply is interrupted).

Among the volatile memory device and the non-volatile memory device, the non-volatile memory device are required to have a higher capacity and higher integration degree as usage of a portable electronic device such as a mobile phone and a notebook computer increases.

Therefore, integration degree improvement of a two-dimensional non-volatile memory device that forms a memory cell as a single layer on a substrate reaches a limit, a non-volatile memory device of a three-dimensional structure that vertically stacks memory cells on a substrate has been proposed.

SUMMARY

A semiconductor memory device according to an embodiment of the present disclosure includes a stack structure including first material films stacked, but spaced apart from each other, in a slimming region, the first material films being stacked in a step structure in the slimming region, a contact hole exposing a portion of the first material films formed in different layers in the slimming region, a plurality of material films that are applied and etched to electrically connect one of the material layers to a peripheral circuit.

A method of manufacturing a semiconductor memory device includes forming a stack structure including first material films stacked, but spaced apart from each other, in a cell region and a slimming region, the first material films being stacked in a step structure in the slimming region, forming a support hole passing through the stack structure in the cell region and a contact hole passing through the stack structure in the slimming region, sequentially forming a second material film and a third material film along an inner surface of the support hole and the contact hole, etching a lower portion of the third and second material films to expose a portion of the first material films through a lower surface of the contact hole, forming a fourth material film along the inner surface of the support hole and the contact hole after etching the lower portion of the third and second material films, and filling the support hole and the contact hole in which the fourth material film is formed with a fifth material film.

DETAILED DESCRIPTION

The advantages and features of the present disclosure, and a method of accomplishing the advantages and features will be described through embodiments that are described in detail below together with the accompanying drawings. However, the present disclosure is not limited to the embodiments described herein but may be embodied in other forms. The present embodiments are provided to describe the technical spirit of the present disclosure in detail to those skilled in the art to which the present disclosure pertains so that those skilled in the art may easily implement the technical spirit of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

An embodiment of the present disclosure provides a semiconductor memory device and a method of manufacturing the same capable of preventing a poor connection of a contact plug of the semiconductor memory device.

The present technology may prevent a poor connection of the contact plug of the semiconductor memory device, thereby improving reliability of the semiconductor memory device.

Figure 1:
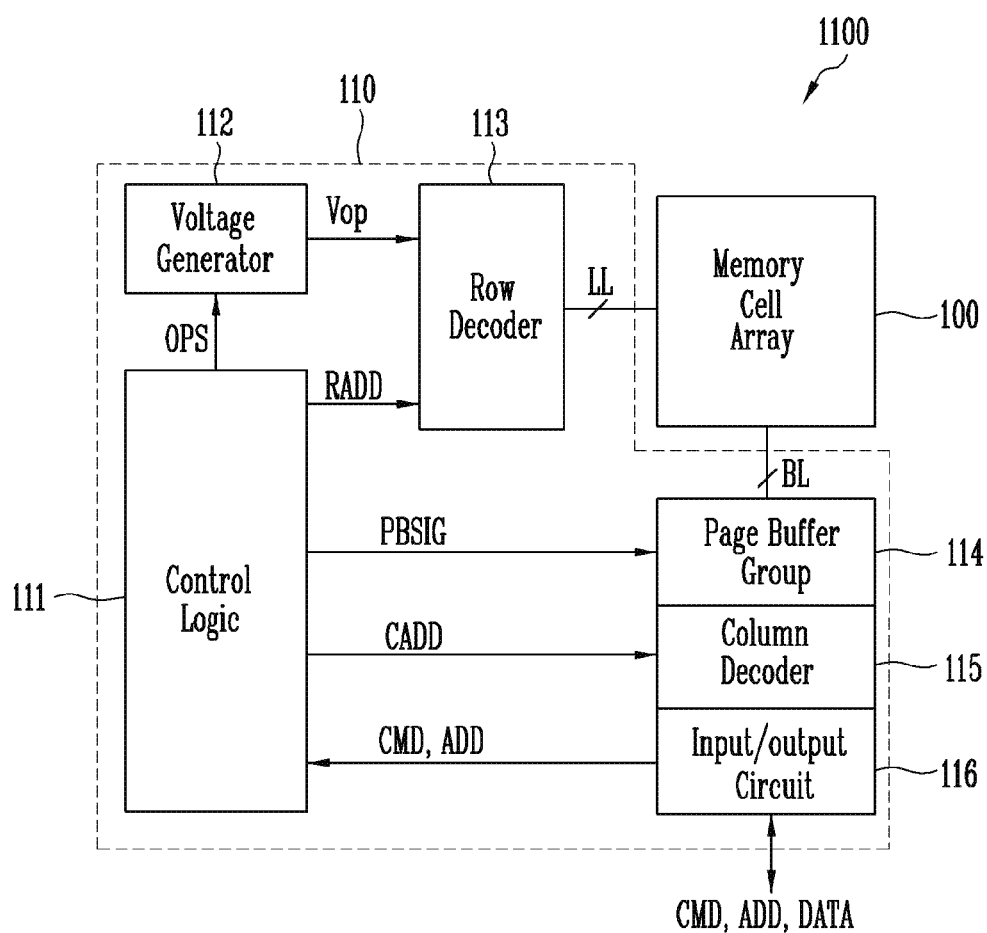
FIG. 1 is a diagram, illustrating a semiconductor memory device, according to an embodiment of the present disclosure.

FIG. 1 is a diagram, illustrating a semiconductor memory device, according to an embodiment of the present disclosure.

Referring to FIG. 1, the semiconductor memory device 1100 may include a memory cell array 100 capable of storing data and peripheral circuits 110 capable of performing a program, read, or erase operation of the memory cell array 100.

The memory cell array 100 may include a plurality of memory blocks including non-volatile memory cells. Local lines LL may be connected to each of the memory blocks, and bit lines BL may be connected to each of the memory blocks.

The peripheral circuits 110 may include a control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 based on a command CMD and an address ADD. For example, the control logic 111 may output an operation signal OPS and a page buffer control signal PBSIG in response to the command CMD. Furthermore, the control logic 111 may output a row address RADD and a column address CADD in response to the address ADD.

The voltage generator 112 may generate and output operation voltages Vop, that are necessary for the program, read, or erase operation, in response to the operation signal OPS. For example, the voltage generator 112 may generate and output the operation voltages Vop such as a program voltage, a read voltage, an erase voltage, and a pass voltage.

The row decoder 113 may transfer the operation voltages Vop to a selected memory block through the local lines LL in response to the row address RADD.

The page buffer group 114 may include a plurality of page buffers that are connected to the selected memory block through the bit lines BL. The page buffer group 114 may temporarily store data during a program or read operation in response to the page buffer control signal PBSIG.

The column decoder 115 may transfer data between the page buffer group 114 and the input/output circuit 116 in response to the column address CADD.

The input/output circuit 116 may receive the command CMD and the address ADD from an external device and transmit the command CMD and the address ADD to the control logic 111. The input/output circuit 116 may transmit data DATA, received from the external device, to the column decoder 115 during the program operation, and output the data DATA, received from the column decoder 115, to the external device during the read operation.

Figure 2:
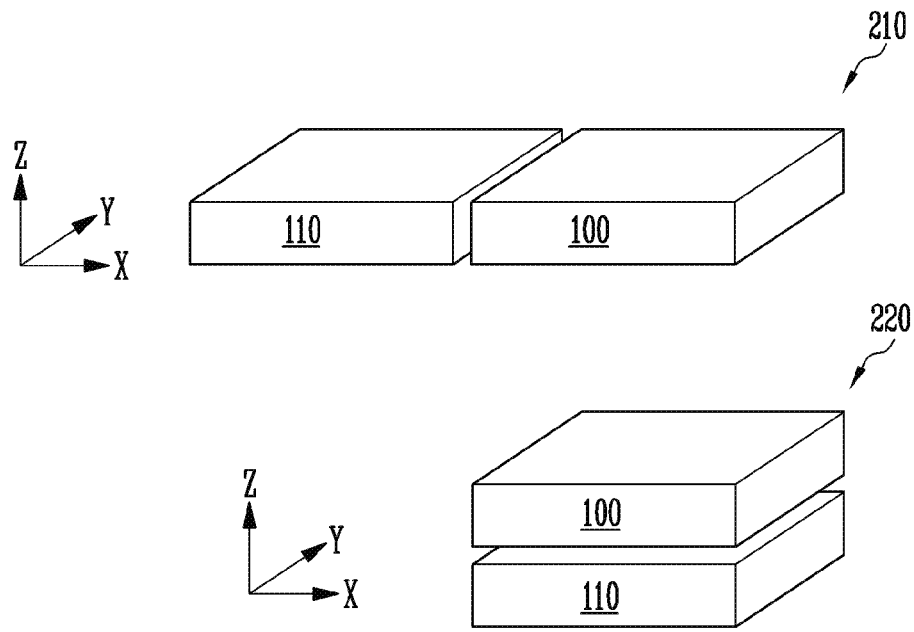
FIG. 2 is a diagram, illustrating a spatial relationship between a memory cell array and peripheral circuits.

FIG. 2 is a diagram, illustrating a spatial relationship between the memory cell array and the peripheral circuits.

Referring to FIG. 2, the memory cell array 100 and the peripheral circuits 110, described above with reference to FIG. 1, may be disposed in various ways. For example, when the substrate is disposed on the X-Y plane, the memory cell array 100 and the peripheral circuits 110 may also be disposed on the X-Y plane, in parallel (shown in 210). Alternatively, the memory cell array 100 may be disposed on the peripheral circuits 110 in a direction (for example, the Z direction) that is perpendicular to the substrate (shown in 220). That is, the peripheral circuits 110 may be disposed between the substrate and the memory cell array 100.

Figure 3:
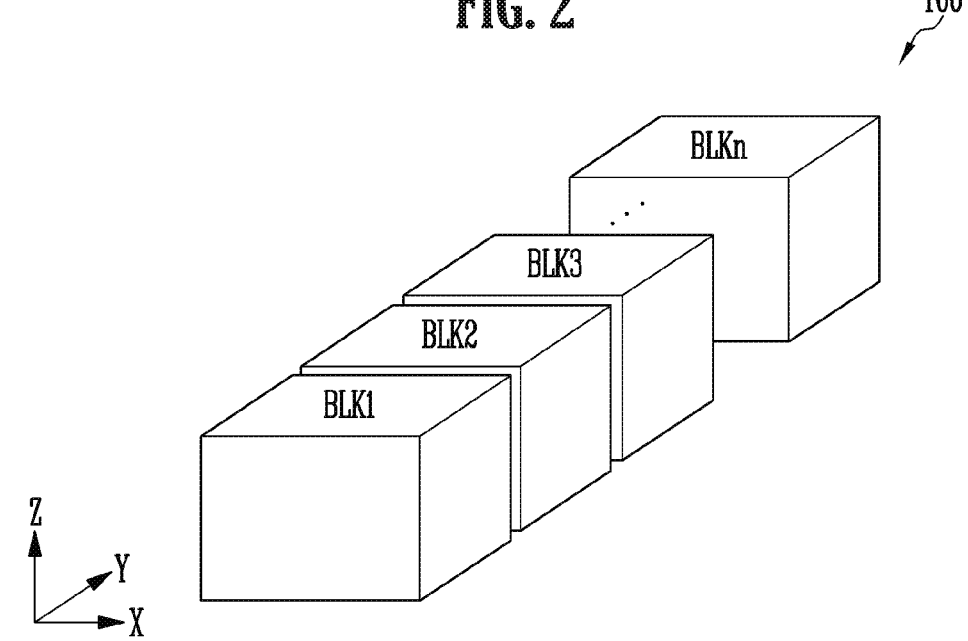
FIG. 3 is a diagram, illustrating a memory cell array including memory blocks formed in a three-dimensional structure.

FIG. 3 is a diagram, illustrating a memory cell array including memory blocks formed in a three-dimensional structure.

Referring to FIG. 3, when the memory cell array 100 includes memory blocks BLK1 to BLKn formed in a three-dimensional structure, the memory blocks BLK1 to BLKn may be arranged in a Y direction. The Y direction may be a direction in which the bit lines BL of FIG. 1 extend.

FIG. 3 illustrates a configuration in which the memory cell array 100 includes one plane. However, the memory cell array 100 may also include a plurality of planes. The plurality of planes may be arranged in an X direction, and the memory blocks, included in each plane, may be arranged in the Y direction in the plane.

Figure 4:
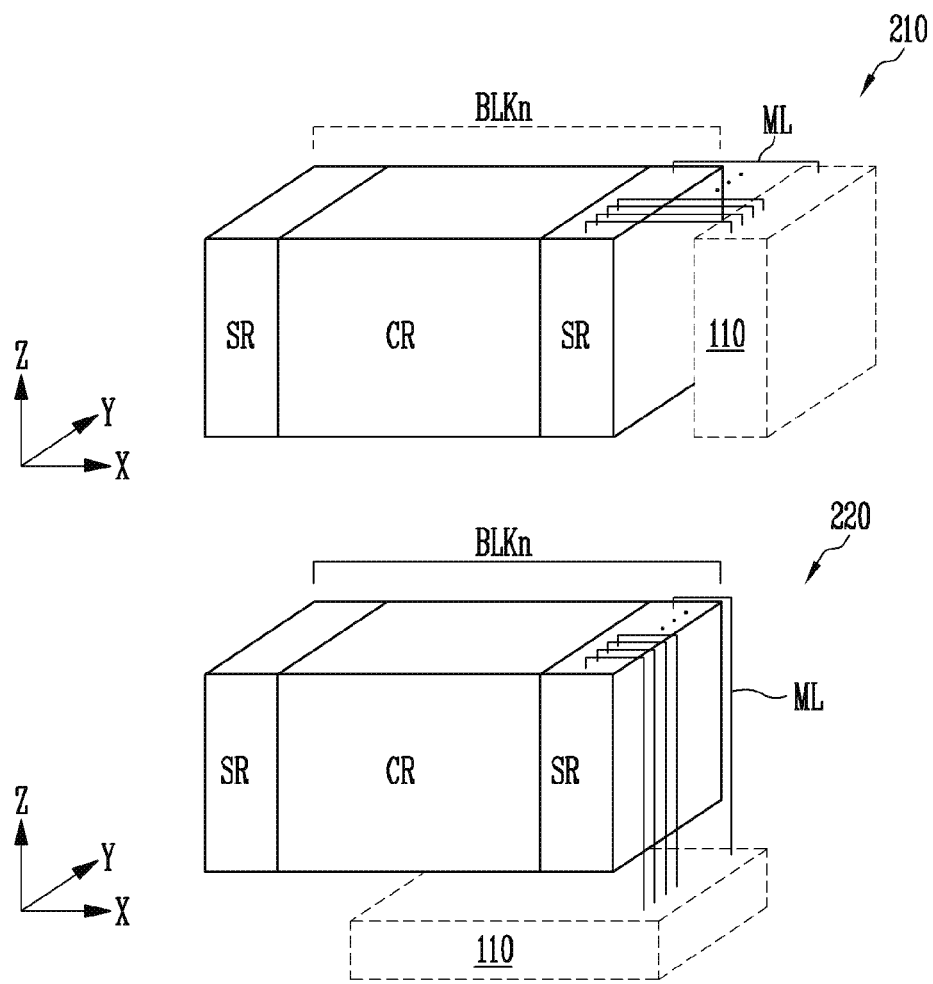
FIG. 4 is a diagram, illustrating a configuration of the memory block and a connection relationship between the memory block and the peripheral circuits.

FIG. 4 is a diagram, illustrating a configuration of the memory block and a connection relationship between the memory block and the peripheral circuits.

The memory blocks BLK1 to BLKn described above with reference to FIG. 3 may be configured to be identical to each other. Therefore, any one of the memory blocks BLK1 to BLKn may be considered as the embodiment based on FIG. 4.

Referring to FIG. 4, the memory block BLKn, formed in a three-dimensional structure, may include a cell region CR with memory cells, and a slimming region SR to electrically connect the peripheral circuits 110 to the cell region CR. For example, the cell region CR may include a plurality of vertical strings in which the memory cells and select transistors are stacked, and the slimming region SR may include end terminals of a plurality of gate lines that are connected to the memory cells and the select transistors. For example, in the slimming region SR, the gate lines may be stacked in a step structure and may be formed in the step structure in which a gate line, disposed at a relatively lower portion, extends longer than a gate line disposed at a relatively higher portion. The gate lines, exposed by the step structure, may be connected to the peripheral circuits 110 through contact plugs.

When the peripheral circuits 110 are disposed in parallel with the memory block BLKn (adjacent in the X direction) (210), a plurality of wires ML, electrically connecting the slimming region SR and the peripheral circuits 110 to each other, may be formed. For example, in the 210 structure, the plurality of wires ML may extend in the X direction and may be spaced apart from each other in the Y direction.

When the peripheral circuits 110 are disposed below the memory block BLKn (stacked in the Y direction) (220), the plurality of wires ML, electrically connecting the slimming region SR to the peripheral circuits 110, may extend along the Z direction and may be spaced apart from each other along the Y direction.

Figure 5:
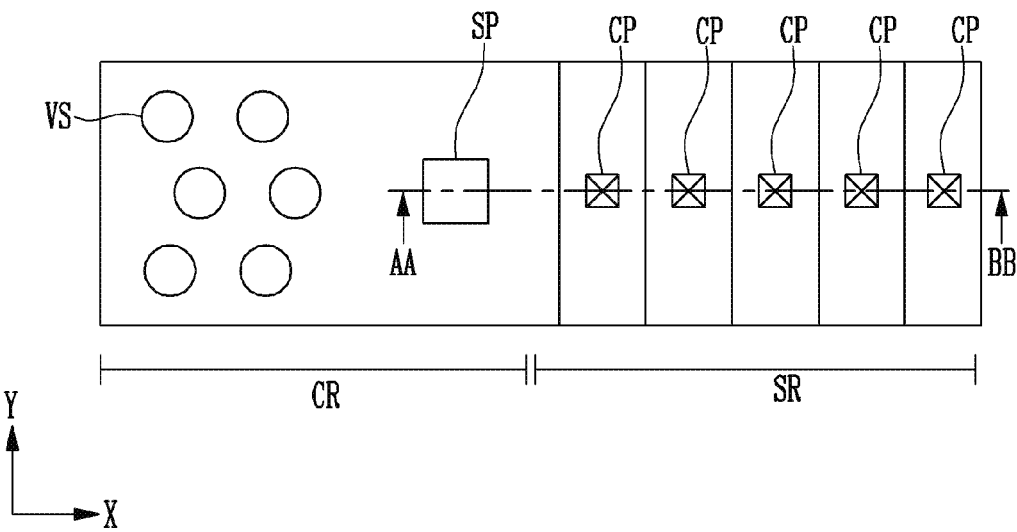
FIG. 5 is a diagram, illustrating a layout of a cell region and a slimming region.

FIG. 5 is a diagram, illustrating a layout of the cell region and the slimming region.

Referring to FIG. 5, a plurality of vertical strings VS and a support plug SP may be formed in the cell region CR, and a plurality of contact plugs CP may be formed in the slimming region SR.

The vertical strings VS may include a plurality of memory cells and a plurality of select transistors and may be formed perpendicular to the substrate. The vertical strings VS may be arranged to be spaced apart from each other along the X-Y plane and may be arranged in various forms in addition to the arrangement shown in FIG. 5.

The support plug SP may be formed to prevent inclination, distortion, and collapse of a plurality of material films that are stacked in the cell region CR. In FIG. 5, the support plug SP is shaped as a quadrangle. However, the support plug SP may be formed in other shapes such as a circle. In addition, according to the embodiment, the support plug SP may be formed in the cell region CR. However, the location of the support plug SP and the number of support plugs are not limited to the embodiment shown in FIG. 5. For example, two support plugs SP may be formed in the slimming region SR.

The contact plugs CP may supply various operation voltages, output from the peripheral circuits, to the gate lines of the memory block. For example, the operation voltages, output from the peripheral circuits, may be transmitted to the contact plugs CP through the plurality of wires, and the operation voltages, transmitted to the contact plugs CP, may be transmitted to the gate lines.

In FIG. 5, the support plug SP and the contact plugs CP are arranged in the X direction. However, the number and arrangement form of the support plug SP and the contact plugs CP are not limited to the embodiment of FIG. 5.

A method of manufacturing the semiconductor memory device will be described as follows with reference to a partial cross section AA-BB of the cell region CR and the slimming region SR in which each of the above-described support plug SP and contact plugs CP is formed.

FIGS. 6 to 13 are diagrams, illustrating the method of manufacturing the semiconductor memory device, according to an embodiment of the present disclosure. FIGS. 6 to 13 show cross-sections of the cell region CR and the slimming region SR on the substrate.

Figure 6:
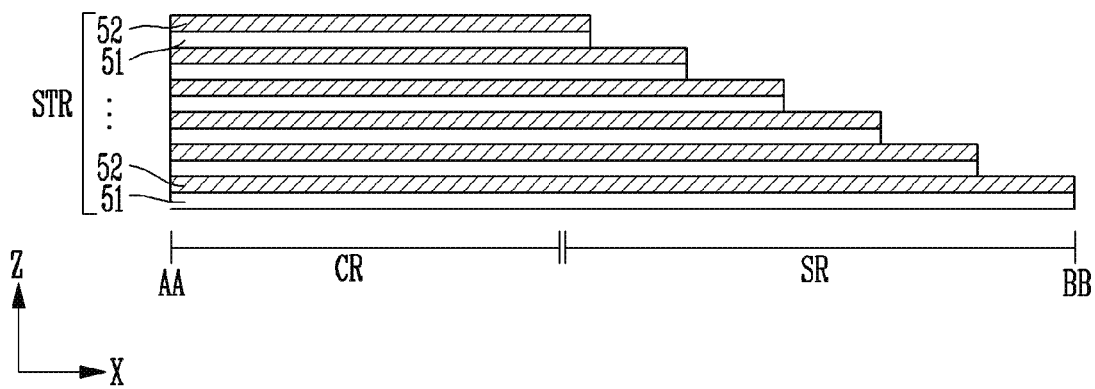
FIGS. 6 to 13 are diagrams, illustrating a method of manufacturing the semiconductor memory device, according to an embodiment of the present disclosure.

Referring to FIG. 6, a stack structure STR may be formed by alternately stacking first material films 51 and second material films 52, along the Z direction, on the cell region CR and the slimming region SR. In the embodiment, the first material films 51 may be formed of an insulating material to be used as an interlayer insulating film (for example, an oxide film). The second material films 52 may be formed of a conductive material to be used as a word line or a select line (for example, a tungsten film).

The first material films 51 and the second material films 52 may be paired, respectively, and may extend in the X direction from the cell region CR to the slimming region SR. In the slimming region SR, the first material films 51 and the second material films 52 may be formed as a step structure, with the films extending longer when moving in the negative z direction. For example, the stack structure STR may be formed as a step structure in which top portions of the second material films 52 of the first material films 51 and the second material films 52 are exposed in the slimming region SR.

Figure 7:
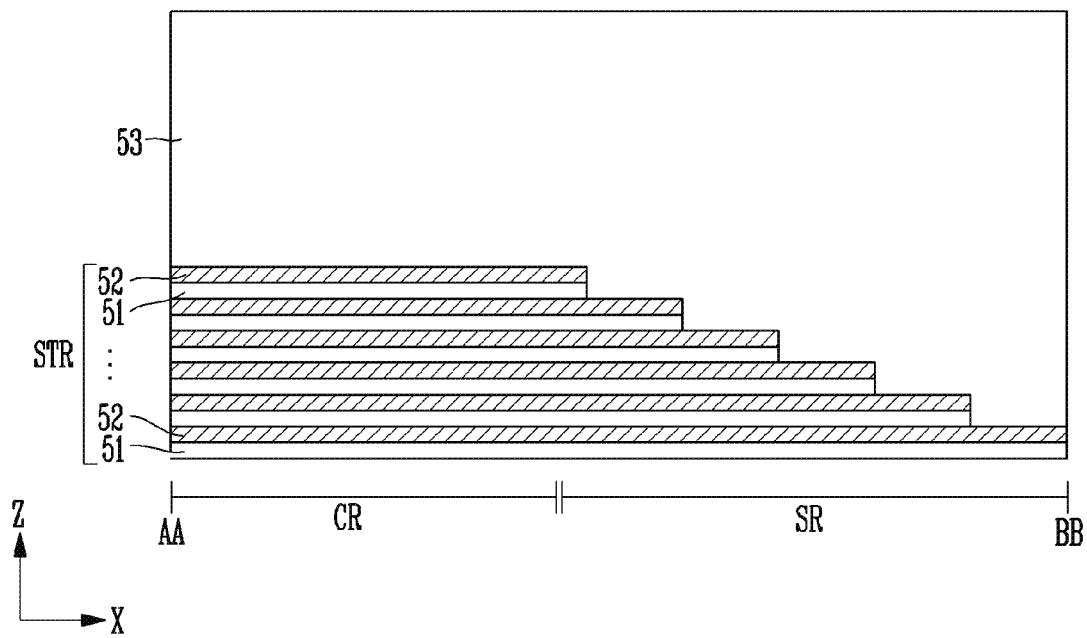

Referring to FIG. 7, a third material film 53 may be formed on the stack structure STR. For example, the third material film 53 may include an oxide film. After the third material film 53 is formed, a planarization process may be performed to flatten an upper surface of the third material film 53. The planarization process may be a chemical mechanical polishing (CMP) process.

Figure 8:
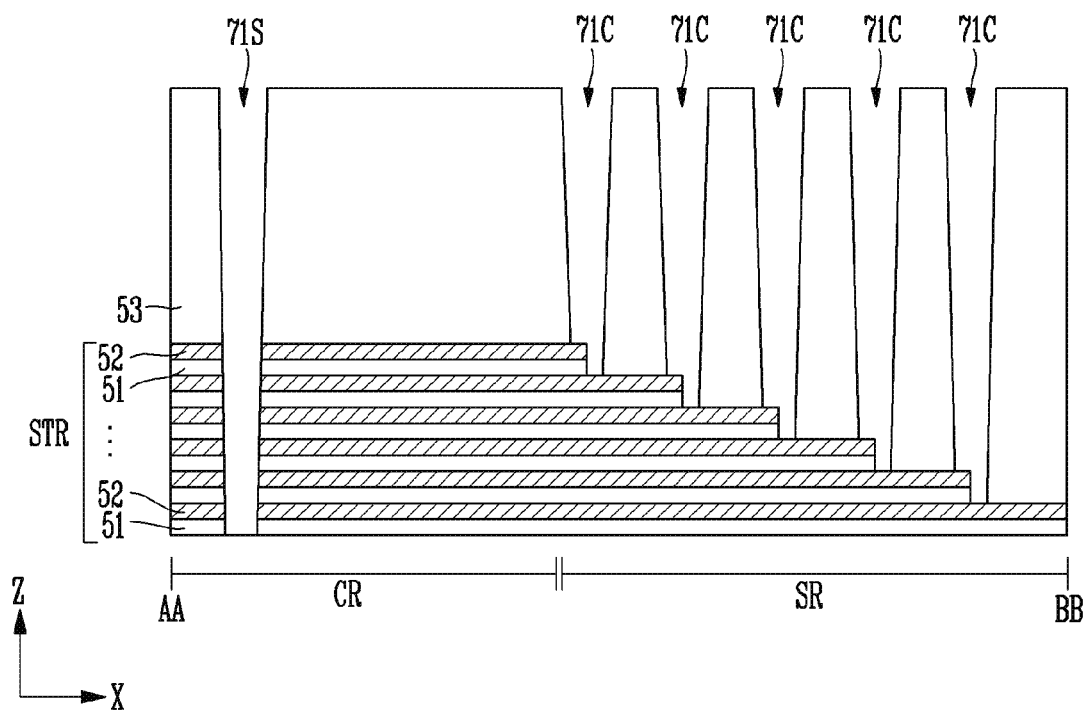

Referring to FIG. 8, a support hole 71S and contact holes 71C may be formed. The support hole 71S may be formed to form the support plug in the cell region CR, while the contact holes 71C may be formed to form the contact plugs in the slimming region SR. For example, after forming the support hole 71S in the stack structure STR of the cell region CR, the contact holes 71C may be formed in the stack structure STR of the slimming region SR. Alternatively, after forming the contact holes 71C in the stack structure STR of the slimming region SR, the support hole 71S may be formed in the stack structure STR of the cell region CR.

The support hole 71S may be formed by vertically passing through the third material film 53 and the stack structure STR to expose a lower structure (not shown), formed under the stack structure STR. The lower structure (not shown) may include a plurality of transistors and an insulating film. The portion exposed through the support hole 71S may be the insulating film.

Each of the contact holes 71C may be formed by vertically passing through the third material film 53 to expose each of the second material films 52 in the stack structure STR having the step structure. Ideally, each of the contact holes 71C should be formed so as to expose only the second material films 52 of one layer. However, due to a size reduction of the stack structure STR or a limitation of an etching process, misalignment may occur. For example, when misalignment occurs in the contact holes 71C, the second material films 52, formed in multiple layers, may be exposed through the same contact hole 71C, and thus, a bridge between different gate lines may occur.

Therefore, in the present embodiment, bridge generation may be prevented by first filling an insulating material in the contact holes 71C. The manufacturing method related to this is described as follows.

Figure 9:
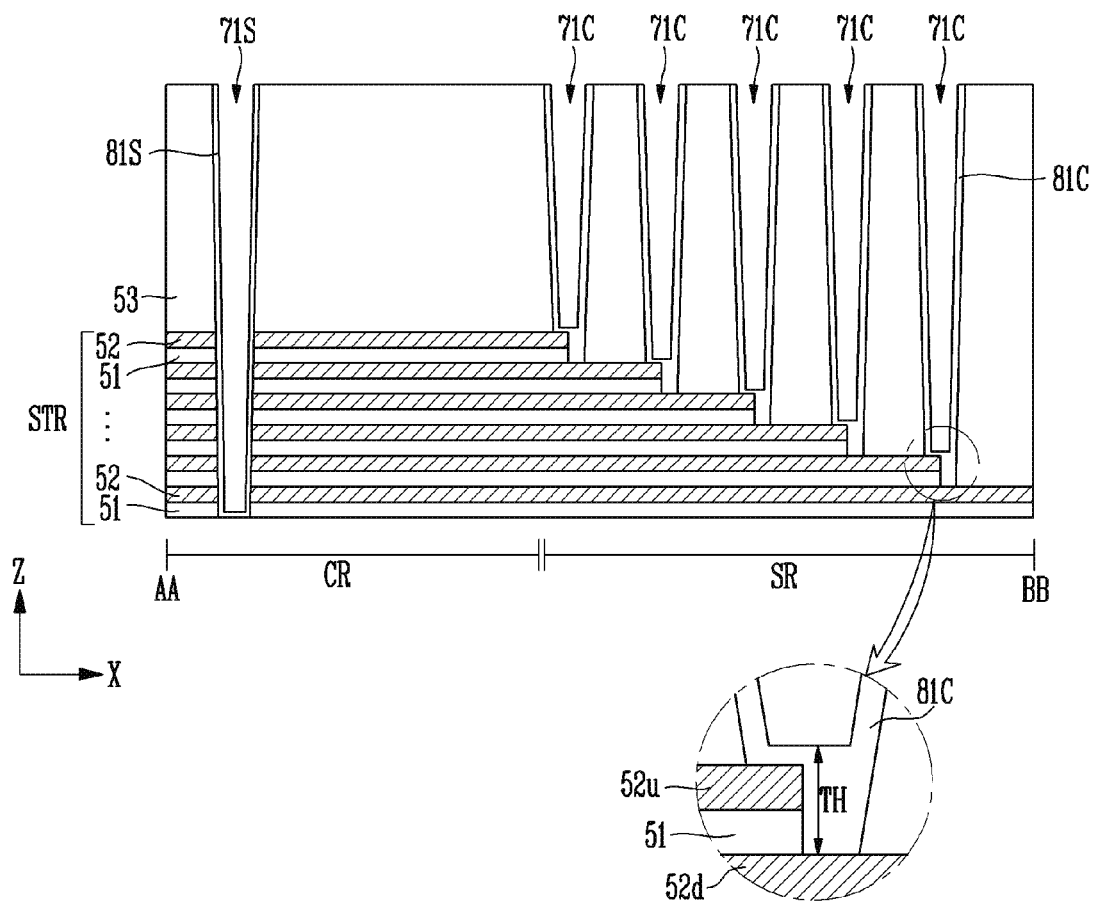

Referring to FIG. 9, fourth material films 81S and 81C may be formed, as a spacer, along an inner surface of the support hole 71S and the contact holes 71C, respectively. For example, the fourth material films 81S and 81C may be formed along an inner side surface and a lower surface of the support hole 71S and the contact holes 71C. The fourth material film 81S and the fourth material films 81C may be the same material and may be simultaneously formed. For example, the fourth material films 81S and 81C may include an oxide film or a silicon oxide film. The fourth material films 81C are formed at a thickness TH on the lower surface of the contact holes 71C to sufficiently cover all of the exposed films. For example, when a lower second material film 52d and an upper second material film 52u are simultaneously exposed through the lower surface of one contact hole 71C, the fourth material film 81C may be formed at the thickness TH to cover both of the lower second material film 52d and the upper second material film 52u.

Figure 10:
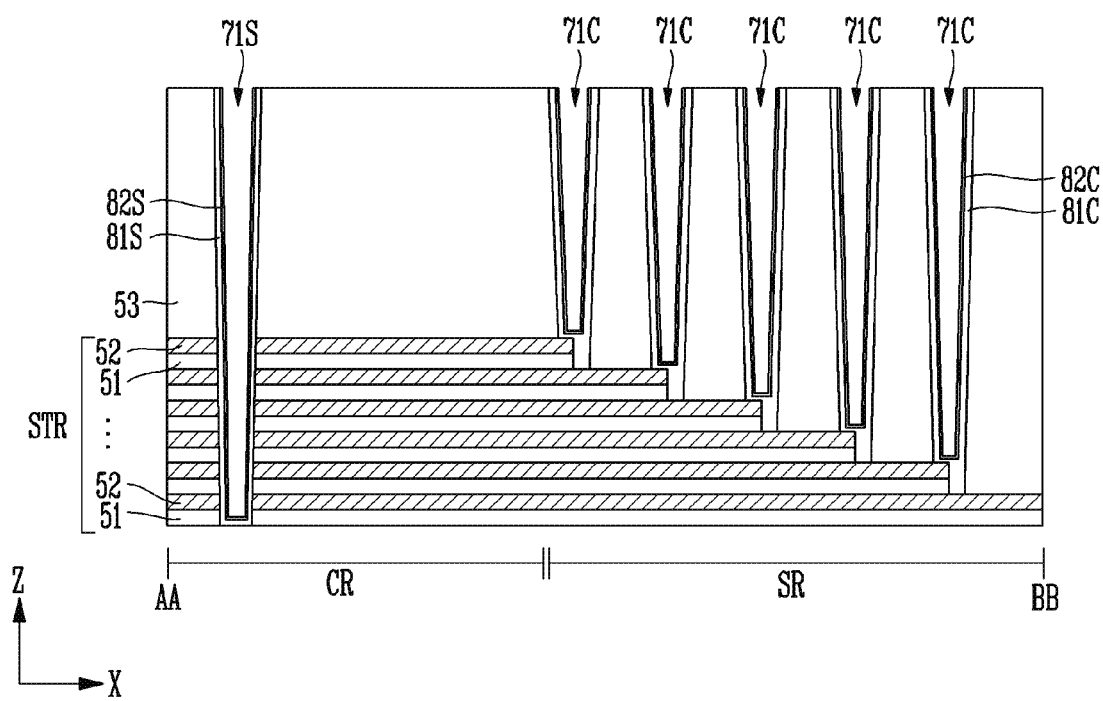

Referring to FIG. 10, fifth material films 82S and 82C may be formed, as a spacer, along an inner surface of the fourth material films 81S and 81C, formed in the support hole 71S and the contact holes 71C, respectively. For example, the fifth material films 82S and 82C may include a nitride film or a silicon nitride film.

Figure 11:
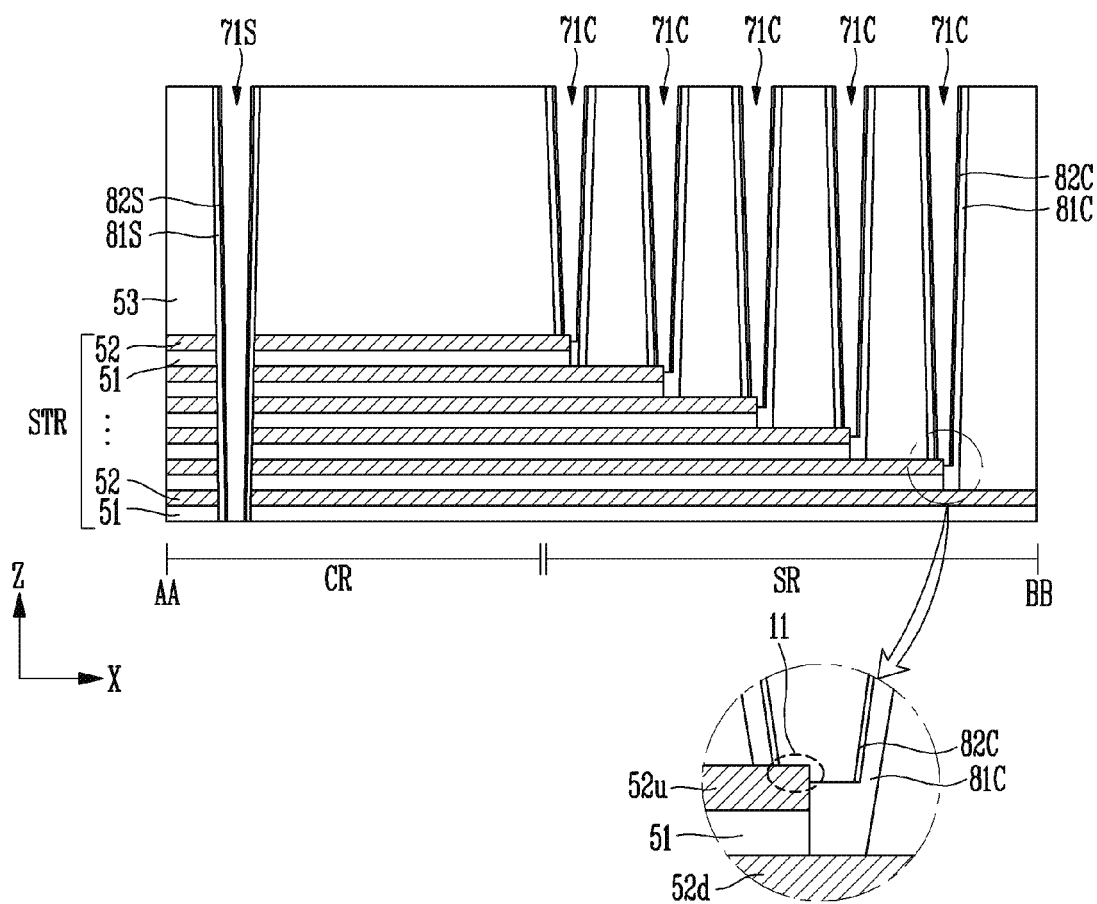

Referring to FIG. 11, an etching process is performed to expose the second material films 52u (11). The etching process may be performed through a dry etching process. More specifically, an anisotropic dry etching process may be performed. When etching the lower surface of the contact holes 71C, since the support hole 71S is also exposed together with the contact holes 71C, the lower structure, formed under the stack structure STR, may also be exposed through the lower surface of the support hole 71S based on the same etching process.

Figure 12:
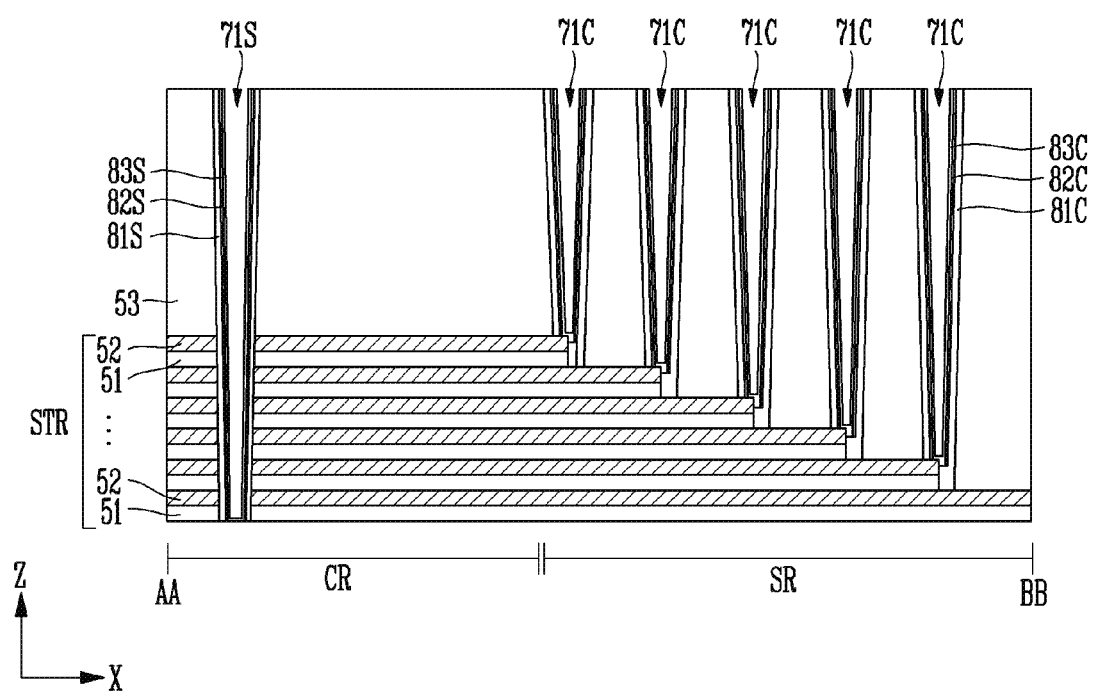

Referring to FIG. 12, sixth material films 83S and 83C are formed along the inner surface of the fifth material films 82S and 82C. The sixth material films 83S and 83C may be used as a barrier film (barrier layer). For example, the sixth material films 83S and 83C may include titanium or a titanium nitride film.

Figure 13:
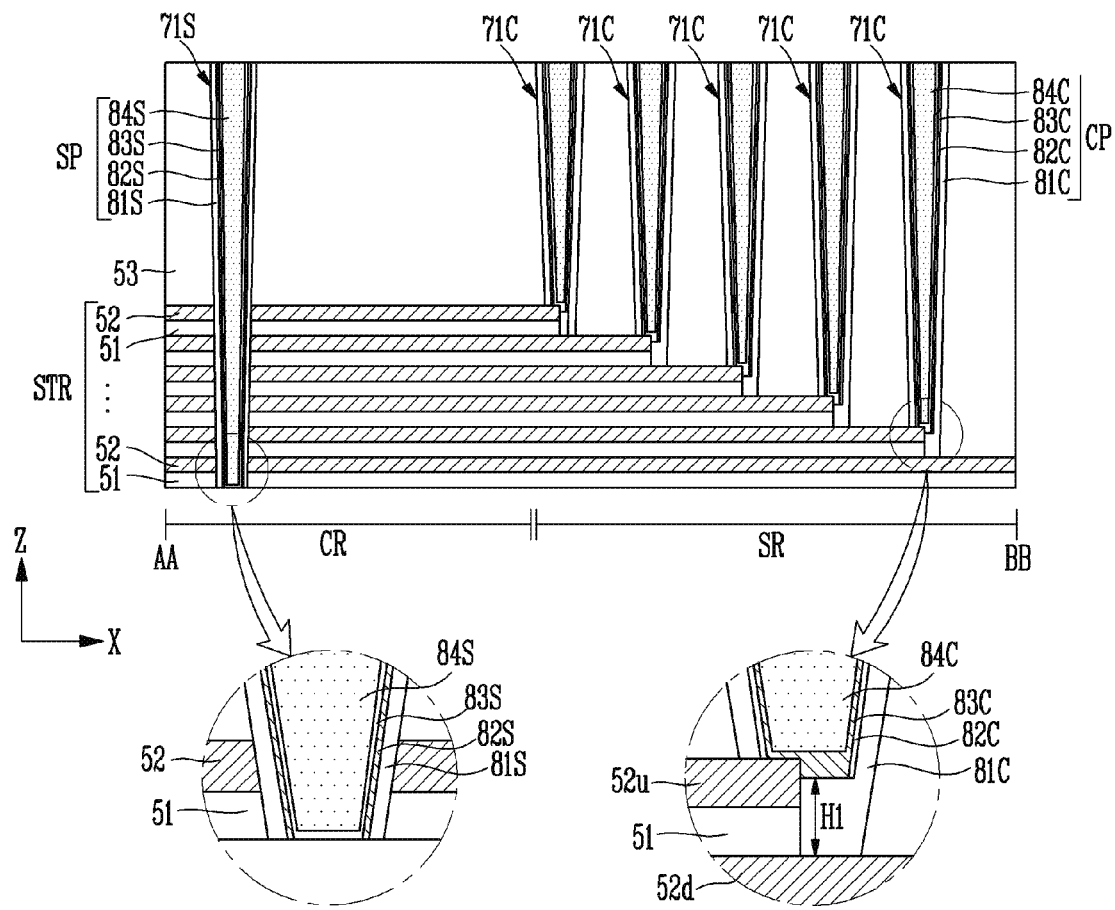

Referring to FIG. 13, seventh material films 84S and 84C are formed on the entire surface of the third material film 53 while filling in the support hole 71S and the contact holes 71C in which the sixth material films 83S and 83C are formed. The seventh material films 84S and 84C may be formed of a conductive film. For example, the seventh material films 84S and 84C may be left in the support hole 71S and the contact holes 71C by performing a planarization process to expose the third material film 53. Therefore, the fourth material film 81S, the fifth material film 82S, the sixth material film 83S, and the seventh material film 84S may be used as the support plug SP in the cell region CR, and the fourth material films 81C, the fifth material films 82C, the sixth material films 83C, and the seventh material films 84C may be used as the contact plugs CP in the slimming region SR. The seventh material films 84S and 84C may be formed of a tungsten film.

In the cell region CR, even though the seventh material film 84S, included in the support plug SP, may be formed of a conductive film, the second material films 52 and the seventh material film 84S may be electrically isolated from each other by the fourth material film 81S and the fifth material film 82S formed on a sidewall of the support hole 71S. Therefore, the support plug SP may prevent the inclination of the second material films 52 for the gate line, but the second material films 52 for the gate lines are not electrically connected to the support plug SP. That is, the support plug SP may be used to support the stack structure STR.

In the slimming region SR, the seventh material films 84C, included in the contact plugs CP, may be electrically connected to the upper second material films 52u through the sixth material films 83C. At this time, since the fourth material film 81C is formed on the lower surface of the contact holes 71C at a first thickness H1, the lower second material films 52d, formed under the contact holes 71C, may be electrically isolated from the seventh material films 84C. That is, even though the upper second material films 52u and the lower second material films 52d are simultaneously exposed due to the misalignment during the etching process, the lower second material films 52d are not exposed through the contact holes 71C since second material films 52d are covered by the fourth material film 81C. Therefore, the seventh material films 84C of the contact plugs CP may be electrically connected to the upper second material films 52u and might not be electrically connected to the lower second material films 52d.

Although not shown in the drawing, the wires ML of FIG. 4 may be formed on the contact plugs CP in a subsequent process, and thus, the second material films 52 for the gate line may be electrically connected to the peripheral circuits 110 of FIG. 4 through the contact plugs CP and the wires ML of FIG. 4.

As described above, since the support plug SP of the cell region CR and the contact plugs CP of the slimming region SR are simultaneously formed, a manufacturing step may be simplified and a manufacturing time may also be reduced. In addition, even though the misalignment occurs in the contact holes 71C in the slimming region SR, since the contact plugs CP are electrically connected only to the upper second material films 52u for the gate line, the bridge occurrence between the gate lines may be prevented.

Figure 14:
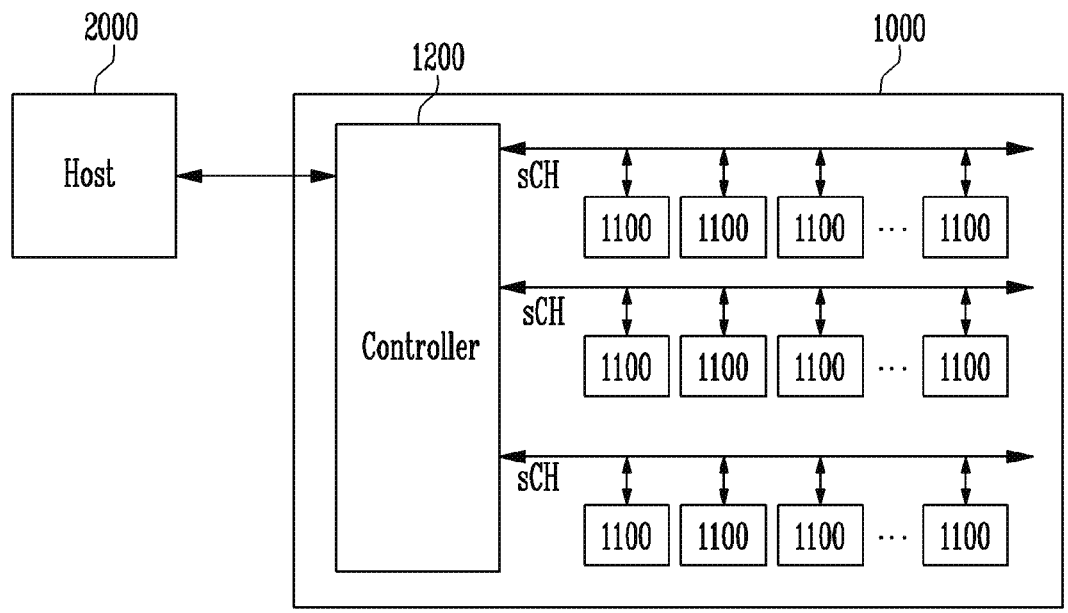
FIG. 14 is a diagram, illustrating an embodiment of a memory system, including the semiconductor memory device, according to an embodiment of the present disclosure.

FIG. 14 is a diagram, illustrating an embodiment of a memory system including the semiconductor memory device, according to an embodiment of the present disclosure.

Referring to FIG. 14, the memory system 1000 may include a plurality of semiconductor memory devices 1100 in which data is stored, and a controller 1200 that communicates between the semiconductor memory devices 1100 and a host 2000.

Each of the semiconductor memory devices 1100 may be the semiconductor memory device described in the above-described embodiment.

The semiconductor memory devices 1100 may be connected to the controller 1200 through a plurality of system channels sCH. For example, a plurality of semiconductor memory devices 1100 may be connected to one system channel sCH, and the plurality of system channels sCH may be connected to the controller 1200.

The controller 1200 may communicate between the host 2000 and the semiconductor memory devices 1100. The controller 1200 may control the semiconductor memory devices based on a request of the host 2000 or may perform a background operation for performance improvement of the memory system 1000 even though there is no request from the host 2000.

The host 2000 may generate requests for various operations and output the generated requests to the memory system 1000. For example, the requests may include a program request that may control a program operation, a read request that may control a read operation, an erase request that may control an erase operation, and the like. The host 2000 may communicate with the memory system 1000 through various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 15:
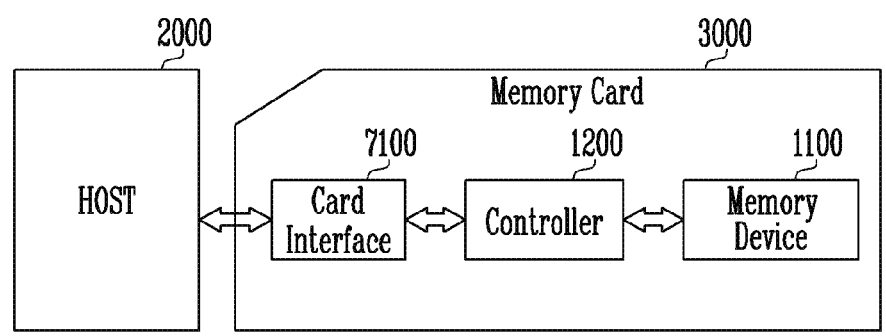
FIG. 15 is a diagram, illustrating another embodiment of the memory system including the semiconductor memory device, according to an embodiment of the disclosure.

FIG. 15 is a diagram, illustrating another embodiment of the memory system including the semiconductor memory device, according to an embodiment of the disclosure.

Referring to FIG. 15, the memory system may be implemented as a memory card 3000. The memory system 3000 may include the semiconductor memory device 1100, the controller 1200, and a card interface 7100.

The controller 2100 may control data exchange between the semiconductor memory device 1100 and the card interface 7100. According to the embodiment, the card interface 7100 may be a secure digital (SD) card interface or a multi-media card (MMC) interface, but is not limited thereto.

The card interface 7100 may interface data exchange between a host 2000 and the controller 1200 based on a protocol of the host 2000. According to the embodiment, the card interface 7100 may support a universal serial bus (USB) protocol, and an inter chip (IC)-USB protocol. Here, the card interface 7100 may refer to hardware capable of supporting a protocol that is used by the host 2000, software installed in the hardware, or a signal transmission method.

When the memory card 3000 is connected to a host interface of the host 2000 such as a PC, a tablet PC, a digital camera, a digital audio player, a mobile phone, a console video game hardware, or a digital set-top box, the host interface may perform communication with the semiconductor memory device 1100 through the card interface 7100 and the controller 1200 under control of a microprocessor of the host 2000.

What is claimed is:

1. A semiconductor memory device comprising:
    a stack structure including first material films stacked and spaced apart from each other, in a slimming region, the first material films being stacked in a step structure in the slimming region;
    contact holes exposing a portion of edges of the first material films formed in different layers in the slimming region; and
    a plurality of material films formed in each of the contact holes and electrically coupled to a peripheral circuit, wherein the plurality of material films include three or more material layers.

2. The semiconductor memory device of claim 1, wherein the three or more material films comprise:
    a second material film formed on a portion of an inner side surface and a lower surface of each of the contact holes;
    a third material film formed on an inner side surface of the second material film;
    a fourth material film formed on an inner side surface and a lower surface of the third material film; and
    a fifth material film filling each of the contact holes in which the fourth material film is formed.

3. The semiconductor memory device of claim 2, wherein the stack structure includes a cell region with the stacked first material films,
    wherein the cell region includes a support hole passing through the stack structure, and
    wherein the second, third, fourth and fifth material films are applied to the support hole as in the contact holes.

4. The semiconductor memory device of claim 3, wherein the second, third, fourth and fifth material films formed in the support hole are used as a support plug for supporting the stack structure, and the second, third, fourth and fifth material films formed in the contact holes are used as a contact plug for electrically connecting the first material films to peripheral circuits.

5. The semiconductor memory device of claim 2, wherein the first material films are formed of a conductive film for a gate line, and the second and third material films are formed of an insulating film.

6. The semiconductor memory device of claim 5, wherein the second material film is formed of an oxide film, and the third material film is formed of a nitride film.

7. The semiconductor memory device of claim 2, wherein the fourth material film is formed of a titanium or titanium nitride film for a barrier film, and the fifth material film is formed of a conductive film.

8. The semiconductor memory device of claim 3, wherein, when a portion of at least two material layers of an upper material layer formed in a relatively higher portion of the stack structure and a lower material layer formed in a lower portion of the stack structure are exposed through the contact holes, the second material film, formed in the contact holes, covers the lower material layer and is formed at a thickness exposing the upper material layer, and the third material film, formed in the contact holes, is formed on the inner side surface of the second material film.

9. The semiconductor memory device of claim 8, wherein the fourth material film, formed in the contact holes, is formed along the inner side surface of the third material film and a surface of the upper material layer exposed through the contact holes.

10. The semiconductor memory device of claim 3, wherein the second and third material films, formed in the support hole, are formed to expose a portion of an upper surface of a lower structure formed under the stack structure.

11. The semiconductor memory device of claim 10, wherein the fourth material film, formed in the support hole, is formed along the inner side surface of the third material film and the exposed upper surface of the lower structure.

* * * * *